United States Patent
Jo et al.

(10) Patent No.: US 10,483,197 B2
(45) Date of Patent: Nov. 19, 2019

(54) SEMICONDUCTOR PACKAGE

(71) Applicant: SAMSUNG ELECTRONICS CO., LTD., Suwon-si (KR)

(72) Inventors: Eun Jung Jo, Suwon-si (KR); Hyung Joon Kim, Suwon-si (KR); Han Kim, Suwon-si (KR); Bo Min Jeong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/962,867

(22) Filed: Apr. 25, 2018

(65) Prior Publication Data

US 2019/0189549 A1   Jun. 20, 2019

(30) Foreign Application Priority Data

Dec. 18, 2017 (KR) .......................... 10-2017-0174234

(51) Int. Cl.
  *H01L 23/495* (2006.01)
  *H01L 23/498* (2006.01)
  (Continued)

(52) U.S. Cl.
  CPC .... *H01L 23/49838* (2013.01); *H01L 23/3128* (2013.01); *H01L 23/367* (2013.01);
  (Continued)

(58) Field of Classification Search
  USPC ................. 257/678–733, 787–796, 257/E23.001–E23.194, 668; 438/15, 26,
  (Continued)

(56) References Cited

U.S. PATENT DOCUMENTS 9,831,214 B2 * 11/2017 Chen .................... H01L 23/5384
2008/0157316 A1   7/2008 Yang
(Continued)

FOREIGN PATENT DOCUMENTS

CN   101232008 A   7/2008
CN   107408547 A   11/2017
(Continued)

OTHER PUBLICATIONS

Korean Office Action dated Sep. 17, 2018 issued in Korean Patent Application No. 10-2017-0174234 (with English translation).
(Continued)

*Primary Examiner* — Niki H Nguyen
(74) *Attorney, Agent, or Firm* — Sughrue Mion, PLLC

(57) ABSTRACT

A semiconductor package includes a first connection member having a first surface and a second surface and including an insulating member and a first redistribution layer, a semiconductor chip connection electrodes disposed on the first connection member, an encapsulant on the second surface of the first connection member, including a photosensitive insulating material, and having a first region covering the active surface of the semiconductor chip and a second region in the vicinity of the semiconductor chip, a second redistribution layer including connection vias penetrating through the first region of the encapsulant, through-vias penetrating through the second region of the encapsulant, and a wiring pattern on the encapsulant and having an integrated structure with the connection vias and the through-vias, and a second connection member on the encapsulant including a third redistribution layer connected to the second redistribution layer.

17 Claims, 17 Drawing Sheets

(51) Int. Cl.
*H01L 23/31* (2006.01)
*H01L 23/367* (2006.01)
*H01L 25/065* (2006.01)
*H01L 23/00* (2006.01)

(52) U.S. Cl.
CPC .. *H01L 23/49822* (2013.01); *H01L 23/49827* (2013.01); *H01L 25/0657* (2013.01); *H01L 24/32* (2013.01); *H01L 2224/32225* (2013.01)

(58) Field of Classification Search
USPC ............... 438/51, 55, 64, 106, 124–127
See application file for complete search history.

(56) References Cited

U.S. PATENT DOCUMENTS

| | | | |
|---|---|---|---|
| 2013/0105991 A1* | 5/2013 | Gan | H01L 25/105 257/777 |
| 2013/0249075 A1 | 9/2013 | Tateiwa et al. | |
| 2014/0103527 A1 | 4/2014 | Marimuthu et al. | |
| 2015/0262909 A1 | 9/2015 | Chen | |
| 2016/0118333 A1* | 4/2016 | Lin | H01L 24/97 257/773 |
| 2016/0338202 A1 | 11/2016 | Park et al. | |
| 2017/0092581 A1* | 3/2017 | Chiu | H01L 21/565 |
| 2017/0103951 A1 | 4/2017 | Lee et al. | |
| 2017/0221859 A1* | 8/2017 | Chen | H01L 21/78 |
| 2018/0076179 A1* | 3/2018 | Hsu | H01L 21/56 |
| 2018/0233457 A1* | 8/2018 | Chen | H01L 23/295 |
| 2018/0366402 A1* | 12/2018 | Huang | H01L 23/49838 |

FOREIGN PATENT DOCUMENTS

| | | |
|---|---|---|
| JP | 2013-197382 A | 9/2013 |
| KR | 10-2015-0106815 A | 9/2015 |
| KR | 10-2016-0132763 A | 11/2016 |
| KR | 10-2017-0043440 A | 4/2017 |
| KR | 10-2017-0071826 A | 6/2017 |
| WO | 2016140818 A2 | 9/2016 |

OTHER PUBLICATIONS

Taiwanese Office Action dated Nov. 27, 2018 issued in Taiwanese Patent Application No. 107115145 (with English translation).
Office Action issued in corresponding Korean Application No. 10-2017-0174234, dated Mar. 11, 2019.

* cited by examiner

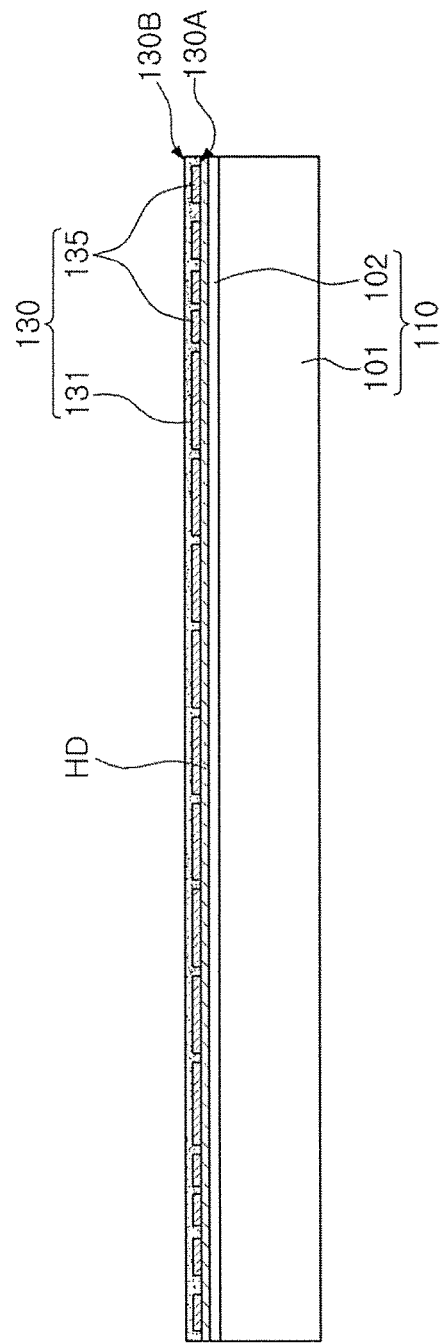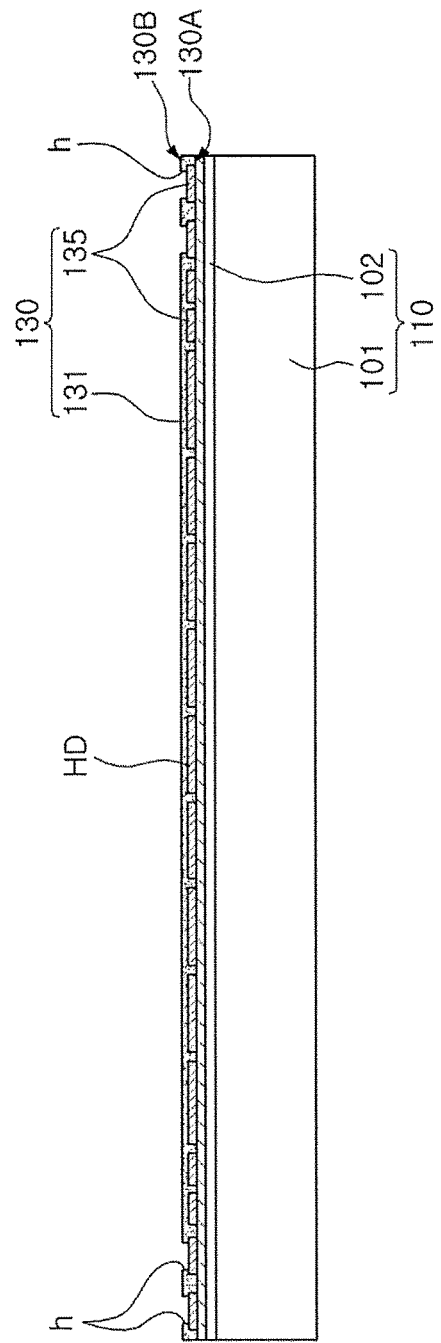

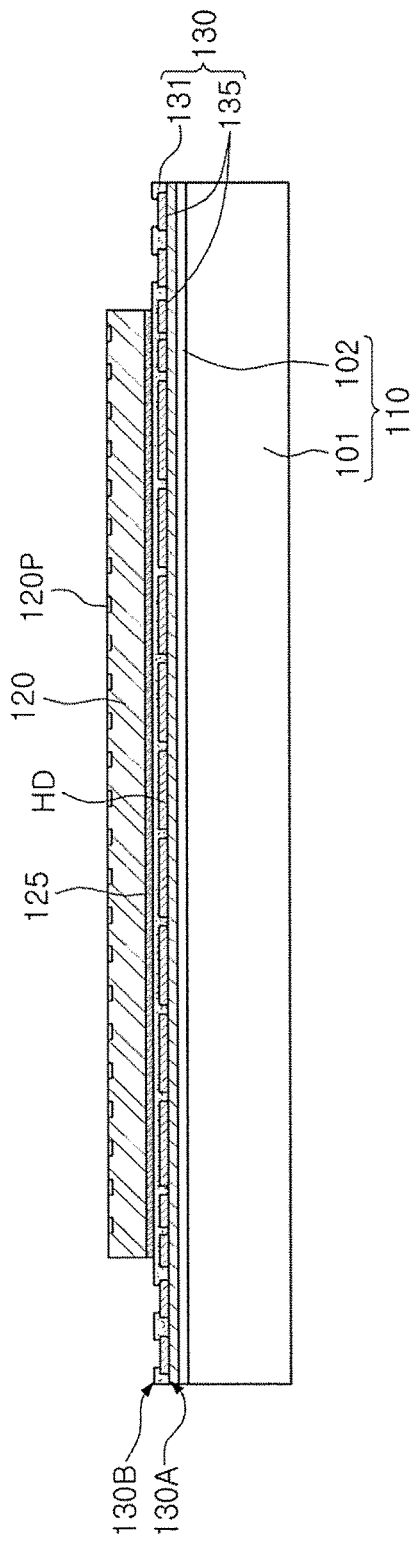
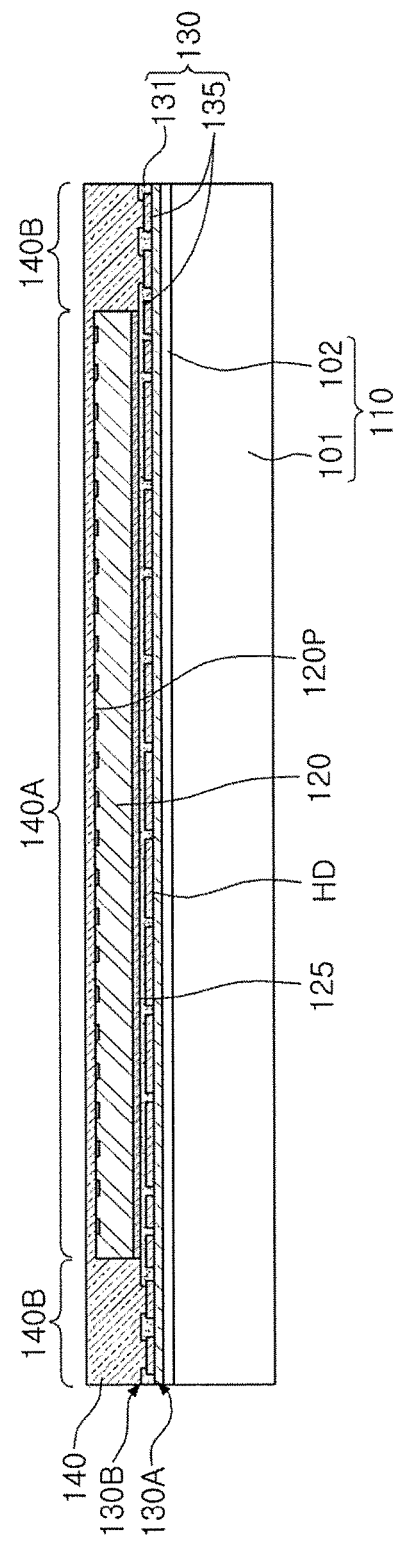
FIG. 13C
FIG. 13D

SEMICONDUCTOR PACKAGE

CROSS-REFERENCE TO RELATED APPLICATION(S)

This application is based on and claims the benefit of priority to Korean Patent Application No. 10-2017-0174234 filed on Dec. 18, 2017 in the Korean Intellectual Property Office, the entire disclosure of which is incorporated herein by reference.

TECHNICAL FIELD

The present disclosure relates to a semiconductor package, and more particularly, to a fan-out semiconductor package for a package-on-package (POP) structure.

BACKGROUND

Recently, a significant recent trend in the development of technologies related to semiconductor packaging is reducing in the overall size of a semiconductor package while maintaining performance of the semiconductor package. As an example, in fan-out semiconductor packaging, connection terminals may be redistributed outwardly of amounting region of a semiconductor chip, such that the connection terminals may be efficiently arranged and the fan-out semiconductor package may be maintained at a small size.

In a package-on-package (POP) structure that has been recently developed, many connection terminals (for example, I/Os) of an upper package and a lower package need to be connected to each other, and a second connection member such as an interposer is required in order to connect the connection terminals to each other.

SUMMARY

An aspect of the present disclosure may provide a semiconductor package of which an increase in a thickness due to introduction of a connection member such as an interposer may be suppressed.

According to an aspect of the present disclosure, a semiconductor package may be provided, in which a process and a structure are simplified by using a connection member manufactured in advance and a connection structure between redistribution layers of connection members disposed on and beneath a semiconductor chip is improved.

According to an aspect of the present disclosure, a semiconductor package may include: a first connection member having a first surface and a second surface opposing each other in a stacking direction of the semiconductor package, the first connection member including an insulating member and a first redistribution layer embedded in the insulating member and having exposed regions in the second surface; a semiconductor chip having an active surface having connection electrodes disposed thereon, and an inactive surface opposing the active surface in the stacking direction and disposed on the first connection member, the inactive surface facing the second surface of the first connection member; an encapsulant disposed on the second surface of the first connection member, including a photosensitive insulating material, and having a first region covering the active surface of the semiconductor chip and a second region positioned in the vicinity of the semiconductor chip; a second redistribution layer including connection vias penetrating through the first region of the encapsulant and connected to the connection electrode, through-vias penetrating through the second region of the encapsulant and connected to the exposed regions of the first redistribution layer, and a wiring pattern disposed on the encapsulant and having an integrated structure with the connection vias and the through-vias; and a second connection member having a first surface disposed on the encapsulant and a second surface opposing the first surface and including a third redistribution layer connected to the second redistribution layer.

According to another aspect of the present disclosure, a semiconductor package may include: a first connection member having a first surface and a second surface opposing each other, including an insulating member and a first redistribution layer embedded in the insulating member, and having holes formed in the second surface to be connected to portions of the first redistribution layer; a semiconductor chip having an active surface having connection electrodes disposed thereon and an inactive surface opposing the active surface and disposed on the first connection member so that the inactive surface faces the second surface of the first connection member; an encapsulant disposed on the second surface of the first connection member, including a photosensitive insulating material, and having a first region covering the active surface of the semiconductor chip and a second region positioned in the vicinity of the semiconductor chip; and a second redistribution layer including connection vias penetrating through the first region of the encapsulant and connected to the connection electrodes, through-vias penetrating through the second region of the encapsulant and connected to the first redistribution layer through the holes of the first connection member, and a wiring pattern disposed on the encapsulant and having an integrated structure with the connection vias and the through-vias.

BRIEF DESCRIPTION OF DRAWINGS

The above and other aspects, features, and advantages of the present disclosure will be more clearly understood from the following detailed description taken in conjunction with the accompanying drawings, in which:

FIGS. 13A through 13G are cross-sectional views for describing main processes of a method of manufacturing the semiconductor package illustrated in FIG. 9.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

The meaning of a "connection" of a component to another component in the description includes an indirect connection through an adhesive layer as well as a direct connection between two components. In addition, "electrically connected" conceptually includes a physical connection and a physical disconnection.

In addition, an ordinal number such as "first", "second", or the like, is used to distinguish one component from another component, and does not limit a sequence, importance, and the like, of the corresponding components. In some cases, a first element may be referred to as a second element without departing from the scope of the claims set forth herein. Similarly, a second element may also be referred to as a first element.

The term an "exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. For example, singular forms need to be interpreted as including plural forms unless interpreted otherwise in context.

Electronic Device

Figure 1:
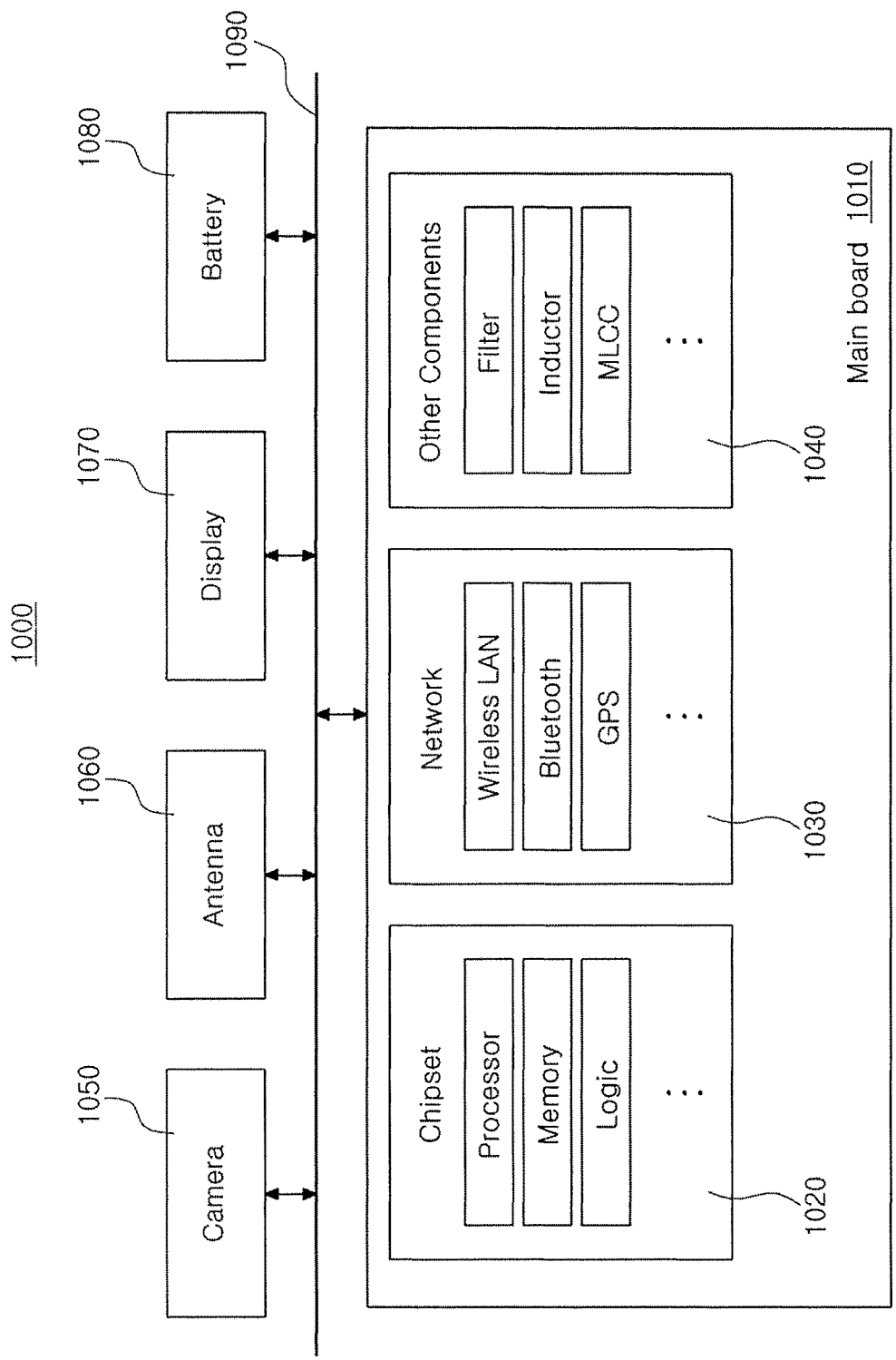
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+) high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
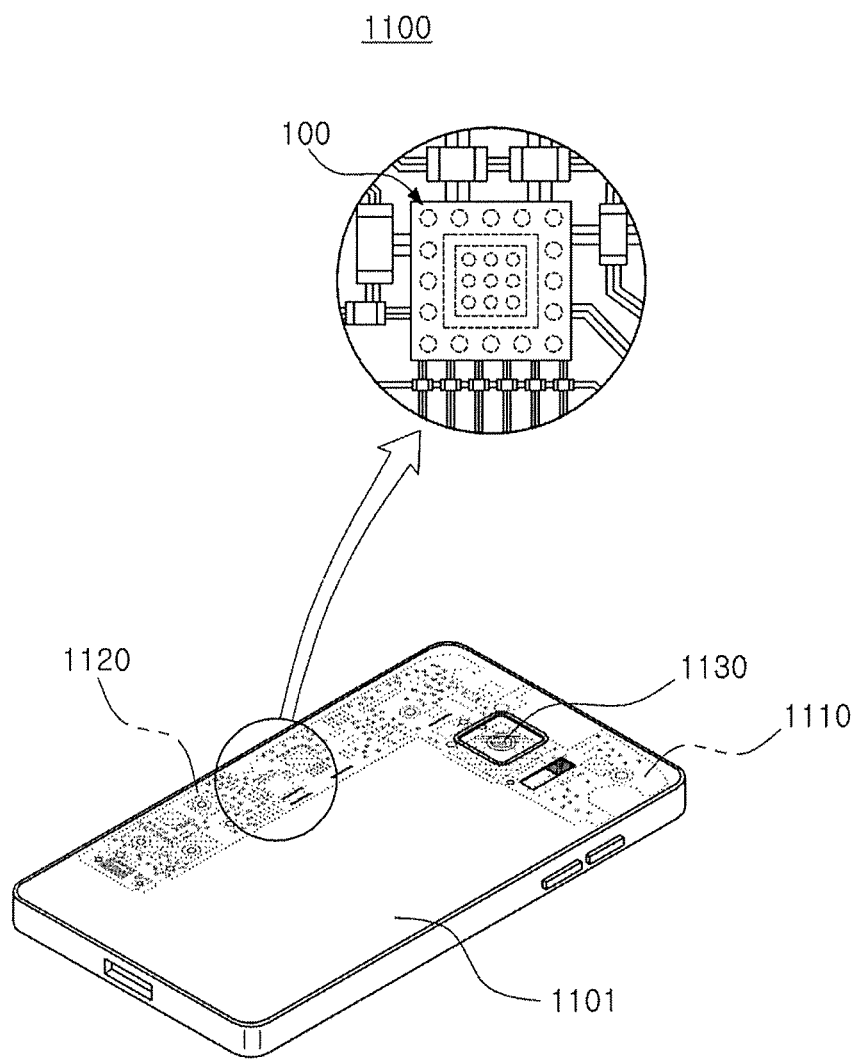
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the mainboard 1010, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a semiconductor finished product in oneself, and may be damaged due to external physical or chemical impact. Therefore, the semiconductor chip is not used in oneself, and is packaged and is used in an electronic device, or the like, in a package state.

The reason why semiconductor packaging is required is that there is a difference in a circuit width between the semiconductor chip and a mainboard of the electronic device in terms of electrical connection. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the accompanying drawings.

Fan-In Semiconductor Package

Figure 3B:
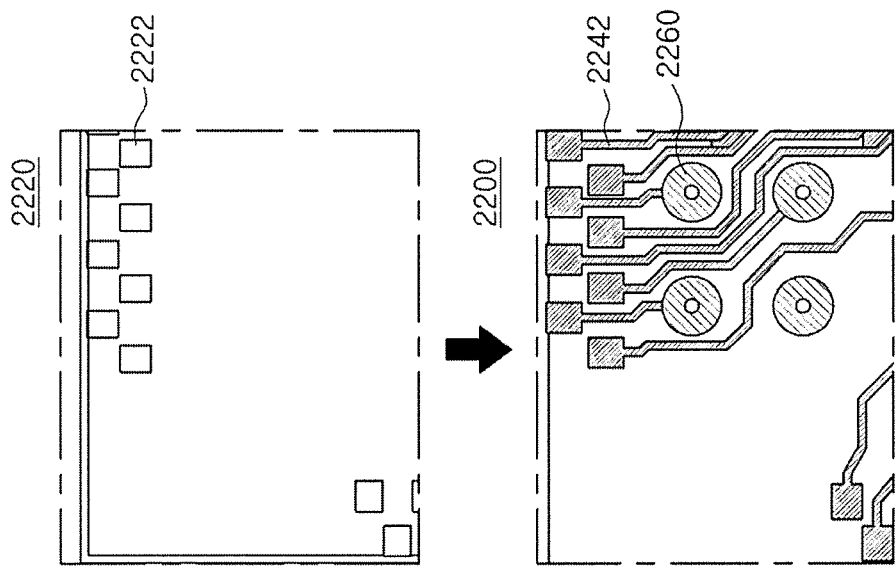
FIGS. 3A and 3B are schematic cross-sectional views illustrating states of a fan-in semiconductor package before and after being packaged.
Figure 3A:
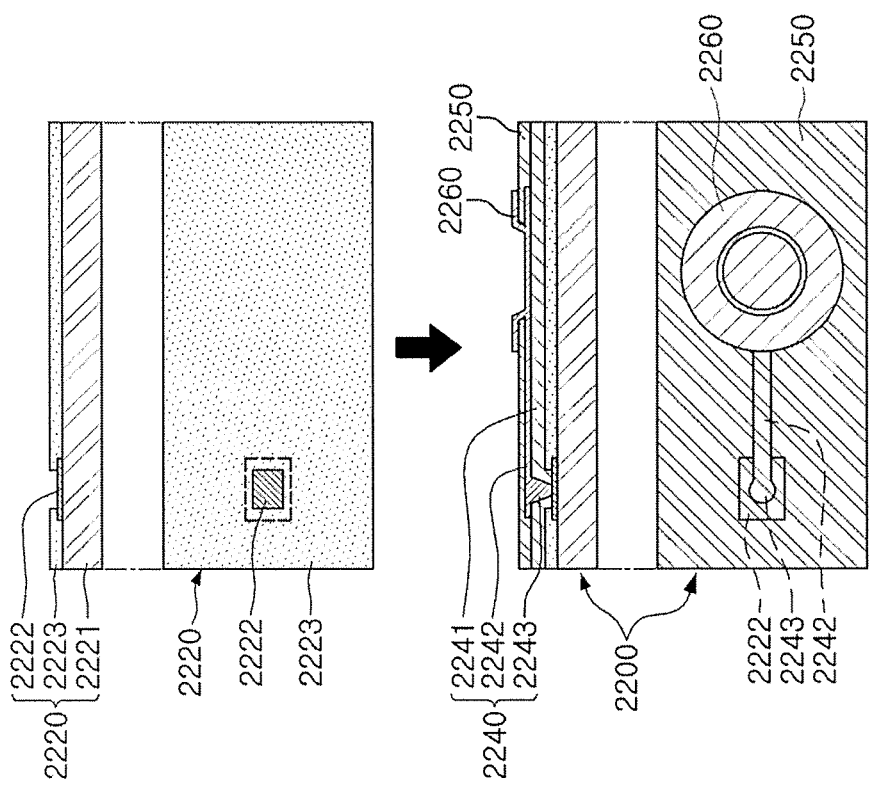
Figure 4:
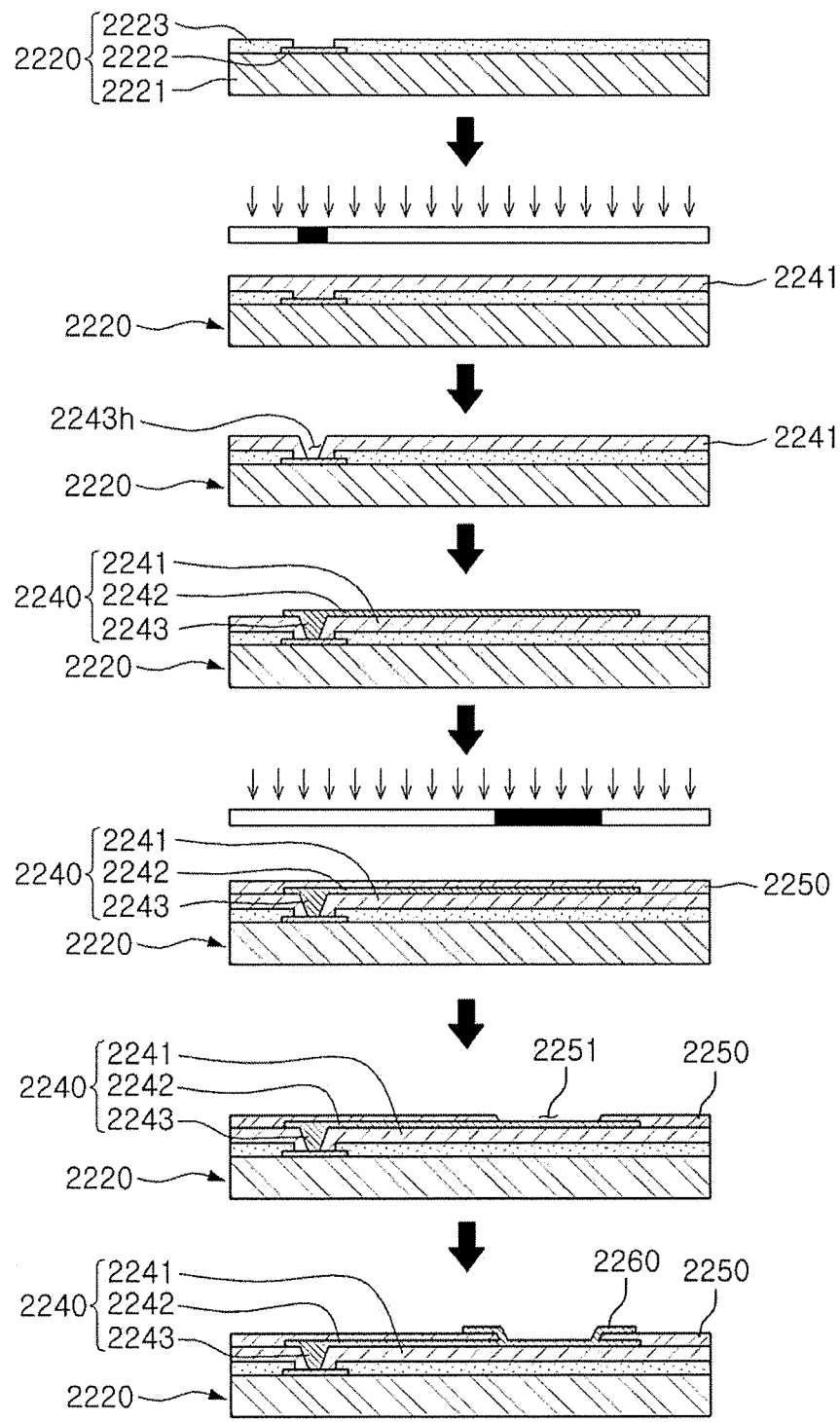
FIG. 4 is schematic cross-sectional views illustrating a packaging process of a fan-in semiconductor package.

FIGS. 3A and 3B are schematic cross-sectional views illustrating states of a fan-in semiconductor package before and after being packaged, and FIG. 4 is schematic cross-sectional views illustrating a packaging process of a fan-in semiconductor package.

Referring to FIGS. 3 and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a small size. In addition, due to the disadvantage described above, the fan-in semiconductor package may not be directly mounted and used on the mainboard of the electronic device. The reason is that even in the case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
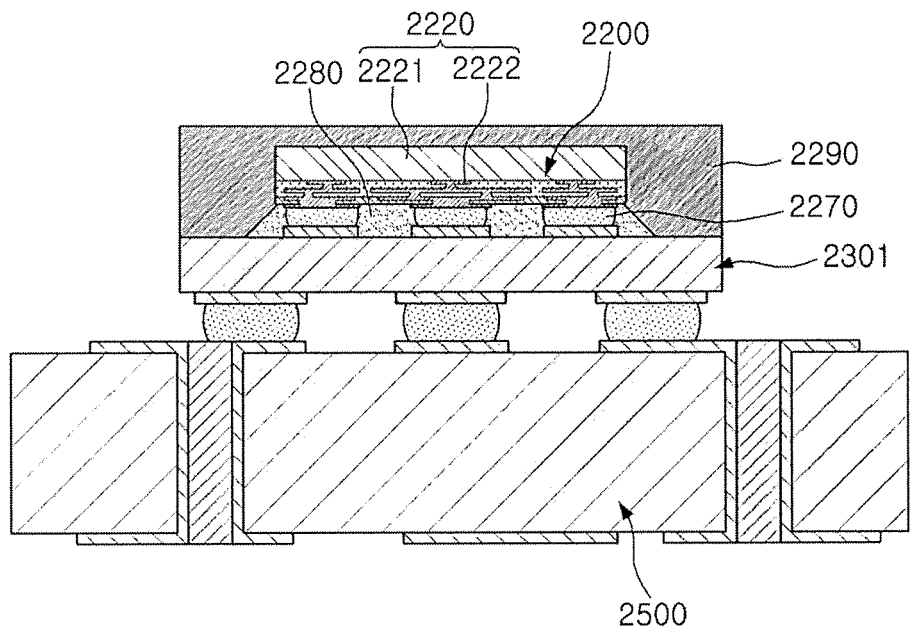
FIG. 5 is a schematic cross-sectional view illustrating a case in which a fan-in semiconductor package is mounted on an interposer substrate and is ultimately mounted on a mainboard of an electronic device.
Figure 6:
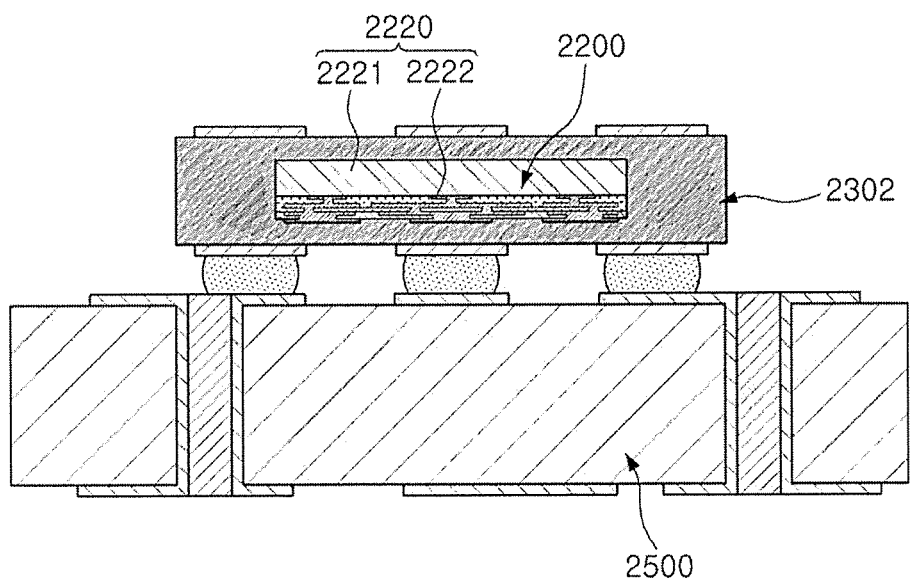
FIG. 6 is a schematic cross-sectional view illustrating a case in which a fan-in semiconductor package is embedded in an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device, and FIG. 6 is a schematic cross-sectional view illustrating a case in which a fan-in semiconductor package is embedded in an interposer substrate and is ultimately mounted on a mainboard of an electronic device.

Referring to FIG. 5, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a mainboard 2500 of an electronic device in a state in which it is mounted on the interposer substrate 2301. In this case, low melting point metal balls 2270, and the like, may be fixed by an underfill resin 2280, or the like, and an outer side of the semiconductor chip 2220 may be covered with an encapsulant 2290, or the like. Alternatively, a fan-in semiconductor package 2200 may be embedded in a separate interposer substrate 2302, connection pads 2222, that is, I/O terminals, of a semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
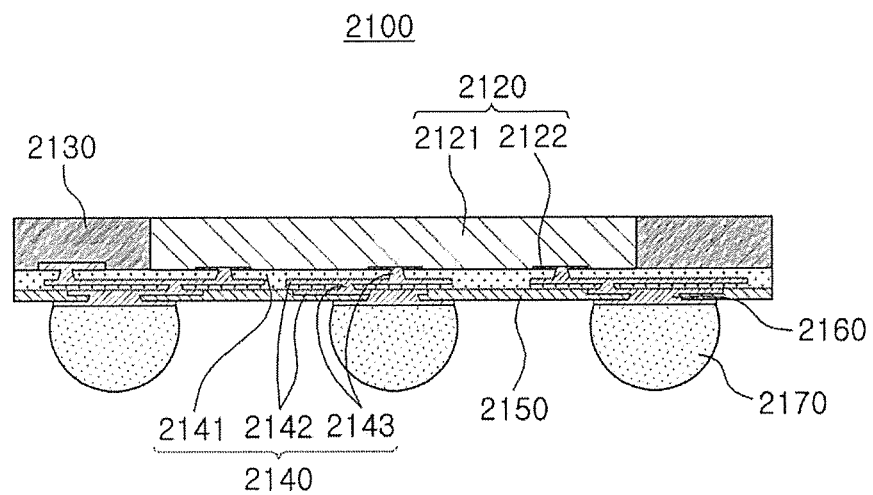
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may be further formed on the connection member 2140, and an underbump metal layer 2160 may be further formed in openings of the passivation layer 2150. Low melting point metal balls 2170 may be further formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

In the present manufacturing process, the connection member 2140 may be formed after the encapsulant 2130 is formed outside the semiconductor chip 2120. In this case, a process for the connection member 2140 is performed from the via connecting the redistribution layers and the connection pads 2122 of the semiconductor chip 2120 to each other and the redistribution layers, and the vias 2143 may thus have a width that decreases as they become to the semiconductor chip (see an enlarged region).

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in the case in which a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
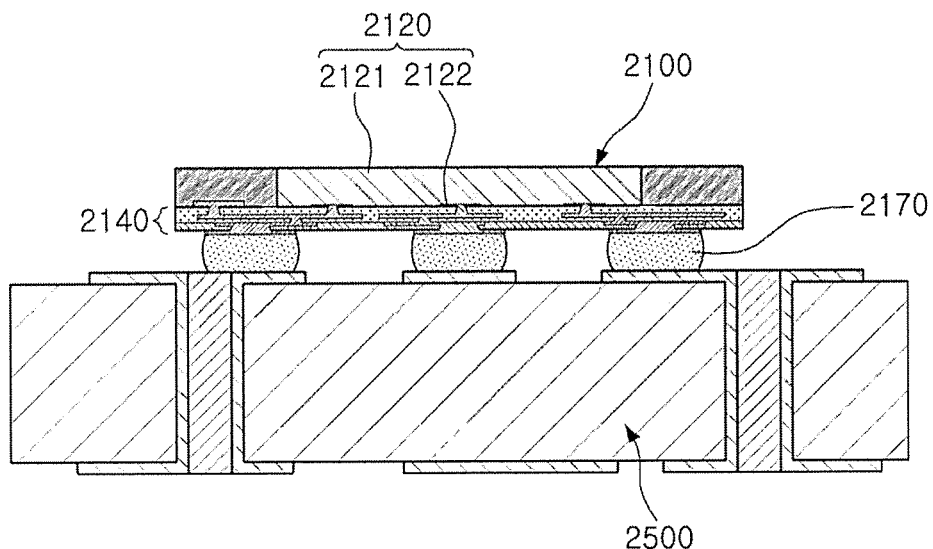
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through low melting point metal balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

A semiconductor package that uses an interposer manufactured in advance will hereinafter be described in detail with reference to the accompanying drawings.

Figure 9:
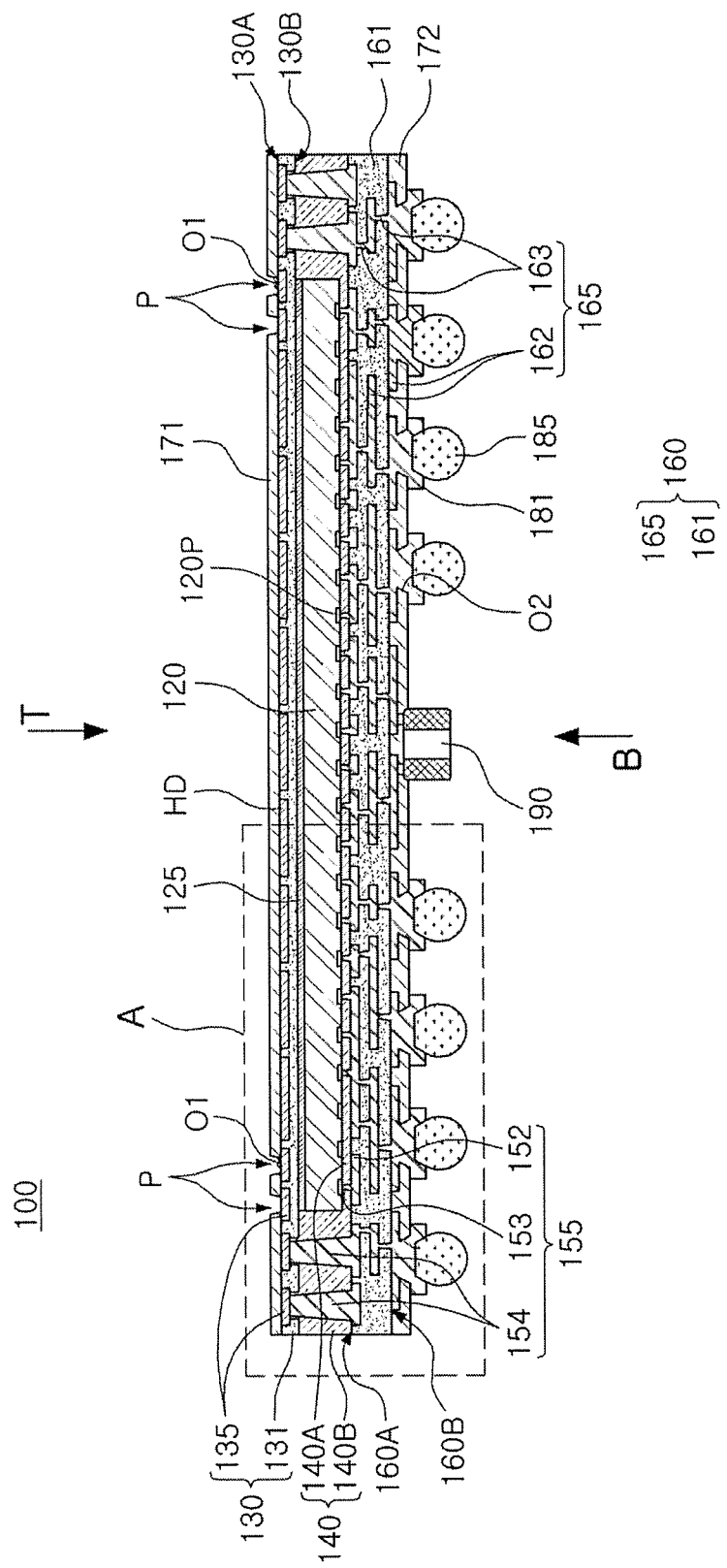
FIG. 9 is a side cross-sectional view illustrating a semiconductor package according to an exemplary embodiment in the present disclosure.
Figure 10A:
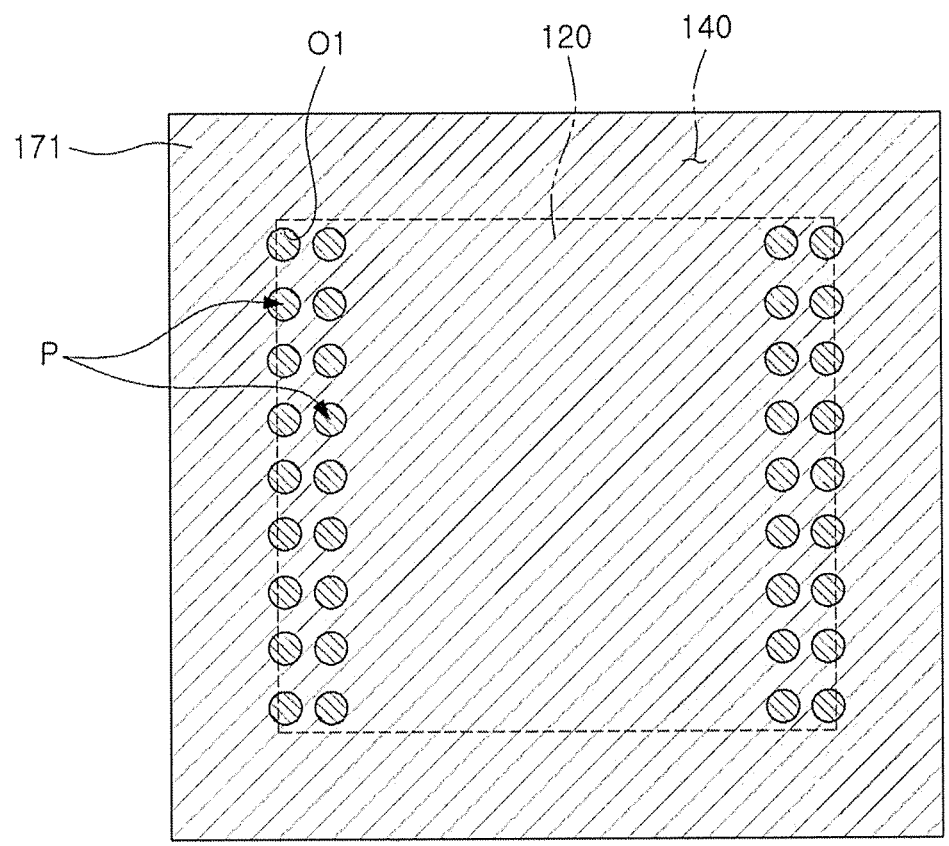
FIGS. 10A and 10B are, respectively, a plan view and a bottom view illustrating the semiconductor package illustrated in FIG. 9.
Figure 10B:
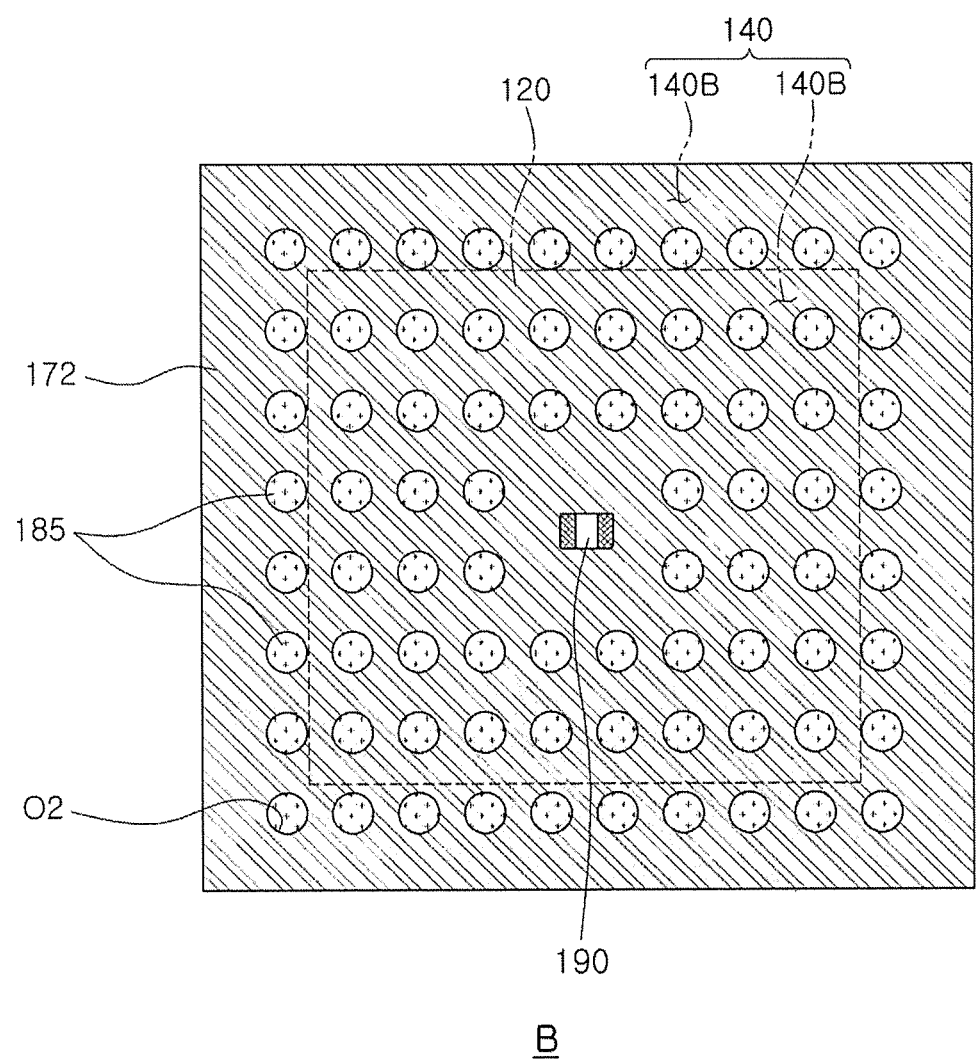

FIG. 9 is a side cross-sectional view illustrating a semiconductor package according to an exemplary embodiment in the present disclosure. FIGS. 10A and 10B are, respectively, a plan view (viewed from "T" of FIG. 9) and a bottom view (viewed from "B" of FIG. 9) illustrating the semiconductor package illustrated in FIG. 9.

Referring to FIG. 9, a semiconductor package 100 according to the present exemplary embodiment may include a first connection member 130 having a first surface 130A and a second surface 130B opposing each other and including a first redistribution layer 135, a semiconductor chip 120 disposed on the second surface 130B of the first connection member 130, an encapsulant 140 disposed on the second surface 130B of the first connection member 130 and covering the semiconductor chip 120, and a second redistribution layer 155 disposed on the encapsulant 140 and connected to the first redistribution layer 135. In addition, the semiconductor package 100 may further include a second connection member 160 having a first surface 160A disposed on the encapsulant 140 and a second surface 160B opposing the first surface 160A and including a third redistribution layer 165 connected to the second redistribution layer 155.

The first connection member 130 used in the present exemplary embodiment may include an insulating member (also referred to as an "insulating layer") and the first redistribution layer 135 including a wiring pattern (also referred to as a "first wiring pattern") embedded in the insulating member 131 and having exposed regions in the second surface 130B. Portions of a region of the first redistribution layer 135 embedded in the insulating member 131 may be exposed in the second surface 130B. This will be described in detail below with reference to FIG. 11.

The semiconductor chip 120 may have an active surface having a plurality of connection electrodes 120P disposed thereon and an inactive surface opposing the active surface. The inactive surface of the semiconductor chip 120 and the second surface 130B of the first connection member 130 may be bonded to each other using a bonding layer 125.

The second redistribution layer 155 used in the present exemplary embodiment may be directly connected to the connection electrodes 120P of the semiconductor chip 120, and may connect the first redistribution layer 135 of the first connection member 130 and the third redistribution layer 165 of the second connection member 160 to each other. The encapsulant 140 may be divided into a first region 140A covering the semiconductor chip 120 and a second region 140B positioned in the vicinity of the semiconductor chip 120.

The second redistribution layer 155 may include connection vias 153 penetrating through the first region 140A of the encapsulant 140 and connected to the connection electrodes 120P and through-vias 154 penetrating through the second region 140B of the encapsulant 140 and connected to the exposed regions of the first redistribution layer 135. In addition, the second redistribution layer 155 may include a second wiring pattern 152 disposed on the encapsulant 140 and connected to at least one of the connection vias 153 and the through-vias 154. The third redistribution layer 165 may be connected to the connection vias 153 and the through-vias 154 through the second wiring pattern 152.

The first passivation layer 171 may be formed on the first surface 130A of the first connection member 130. The first passivation layer 171 may have first openings O1 defining regions of a plurality of pads P. The first openings O1 may be formed to correspond to an array of connection terminals of another semiconductor chip and package to be disposed on the semiconductor package. The plurality of pads P may be formed using a metal such as Au, and be provided as pads fora connection to another package and chip.

Electrical connection structures 185 connected to the third redistribution layer 165 may be disposed on the second surface 160B of the second connection member 160. The electrical connection structure 185 may be connected to the third redistribution layer 165 through an underbump metallurgy (UBM) layer 181. The second passivation layer 172 may be formed on the second surface 160B of the second connection member 160. The second passivation layer 172 may have second openings O2 defining regions of the third redistribution layer 165 connected to the UBM layer 181.

In the present exemplary embodiment, as illustrated in FIG. 10A, the plurality of pads P may have pads disposed in an array of 9×2 at each of both sides of the semiconductor package 100. As illustrated in FIG. 10B, the electrical connection structures 185 is illustrated in an array of 10×10 except for a central region (4×4). The plurality of pads P and the electrical connection structures 185 may be divided into fan-in pads that overlap the semiconductor chip 120 and fan-out pads that do not overlap the semiconductor chip 120.

The plurality of pads P may have an array corresponding to that of connection terminals of an upper semiconductor package mounted on the semiconductor package 100, and the electrical connection structures 185 may be arrayed to correspond to connection terminals of a motherboard on which the semiconductor package 100 is to be disposed. The plurality of pads P and the electrical connection structures 185 may be formed to have various other numbers and be formed in various arrays depending on the upper semiconductor package and the motherboard.

As described above, the plurality of pads P and the electrical connection structures 185 may be connected to each other and may also be connected to the semiconductor chip 120 by the first and third redistribution layers 135 and 165 together with the second redistribution layer 155.

Figure 11:
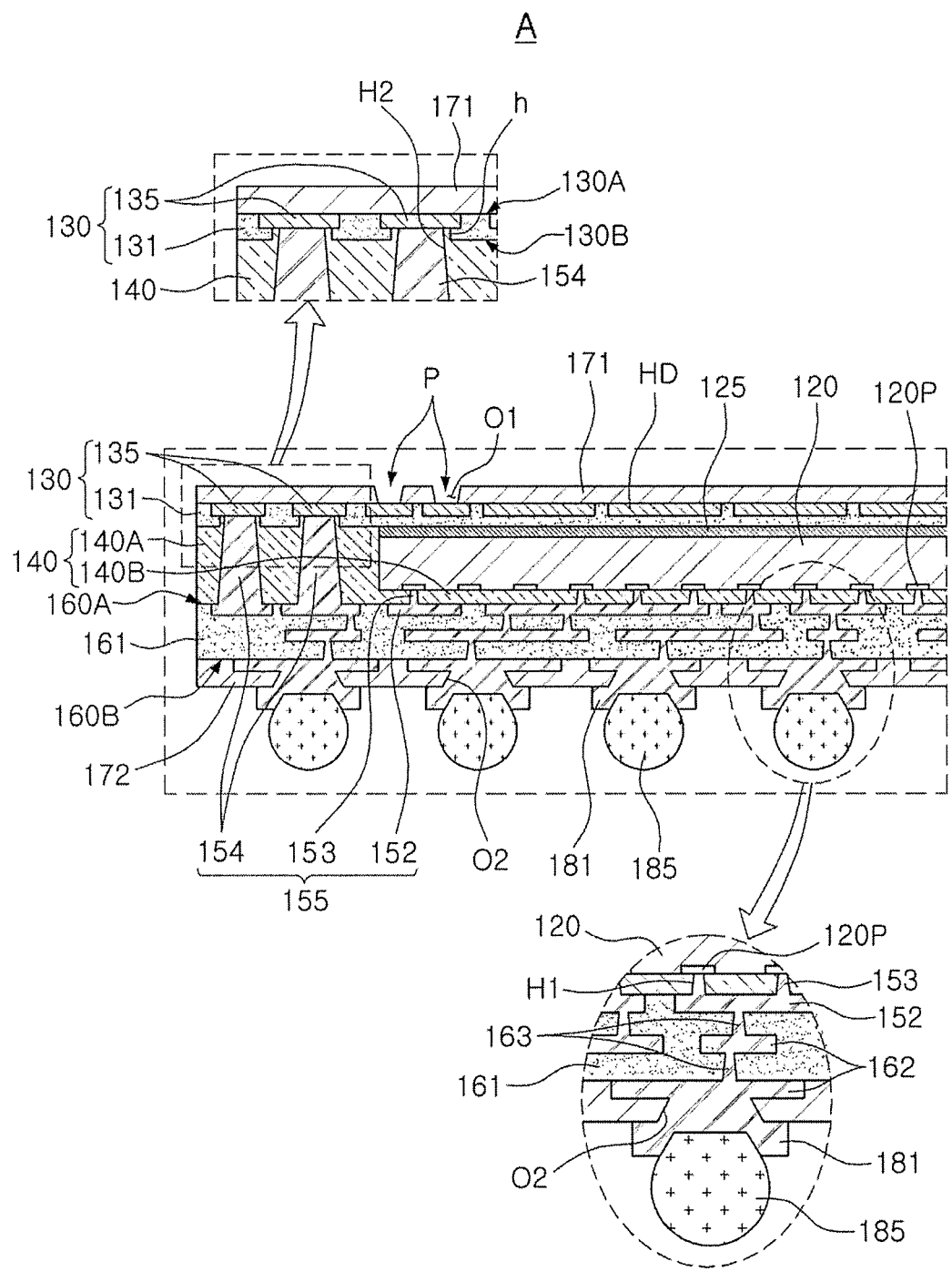
FIG. 11 is an enlarged cross-sectional view illustrating a partial region (region A) of the semiconductor package illustrated in FIG. 9.

In the present exemplary embodiment, vias and patterns constituting the first and third redistribution layers 135 and 165 and the second redistribution layer 155 may have characteristic structures by a unique process. FIG. 11 is an enlarged view of part "A" of the semiconductor package illustrated in FIG. 9.

Referring to FIG. 11, the second wiring pattern 152 may have an integrated structure with the connection vias 153 and the through-vias 154. In the present specification, a term "integrated structure" does not mean that two components are simply in contact with each other, but refers to a structure in which two components are formed integrally with each other using the same material by the same process. For example, the second wiring pattern 152 may be considered to have the "integrated structure" with the connection vias 153 and the through-vias 154 since they are formed simultaneously with the connection vias 153 and the through-vias 154 by the same plating process (see a process of FIG. 13F). As described above, the connection vias 153 and the through-vias 154 may be formed of the same metal. In addition, the connection vias 153 and the through-vias 154 may have integrated structures with the second wiring pattern 152.

The encapsulant 140 may be formed of the photosensitive material. As described above, the encapsulant 140 may cover the semiconductor chip 120 disposed on the second surface 160B of the second connection member 160, and desired first and second holes H1 and H2 may be formed by a precise drilling process (e.g. photolithography) using a photoresist in order to form the connection vias 153 and the through-vias 154 for the second redistribution layer 155 (see FIG. 13E).

The first holes for the connection vias 153 may be formed from an upper surface of the encapsulant 140 toward the semiconductor chip 120. Therefore, an area of a surface of the connection via 153 adjacent to the second connection member 160 may be greater than that of a surface of the connection via 153 adjacent to the first connection member 130 (or the semiconductor chip 120). Likewise, since second holes H2 for the through-vias 154 may be formed from the upper surface of the encapsulant 140 toward the second connection member 160, an area of a surface of the through-via 154 adjacent to the second connection member 160 may be greater than that of a surface of the through-via 154 adjacent to the first connection member 130.

The first redistribution layer 135 of the first connection member 130 may be embedded in the insulating member 131, as described above. Openings h may be formed in the second surface 130B of the insulating member 131, and the first redistribution layer 135 may have the exposed regions through the holes h. The exposed regions of the first redistribution layer 135 may be connected to the through-vias 154 penetrating through the encapsulant 140. The through-vias 154 used in the present exemplary embodiment may be formed through the openings h of the insulating member 131 as well as the second holes H2 of the encapsulant 140.

Figure 14:
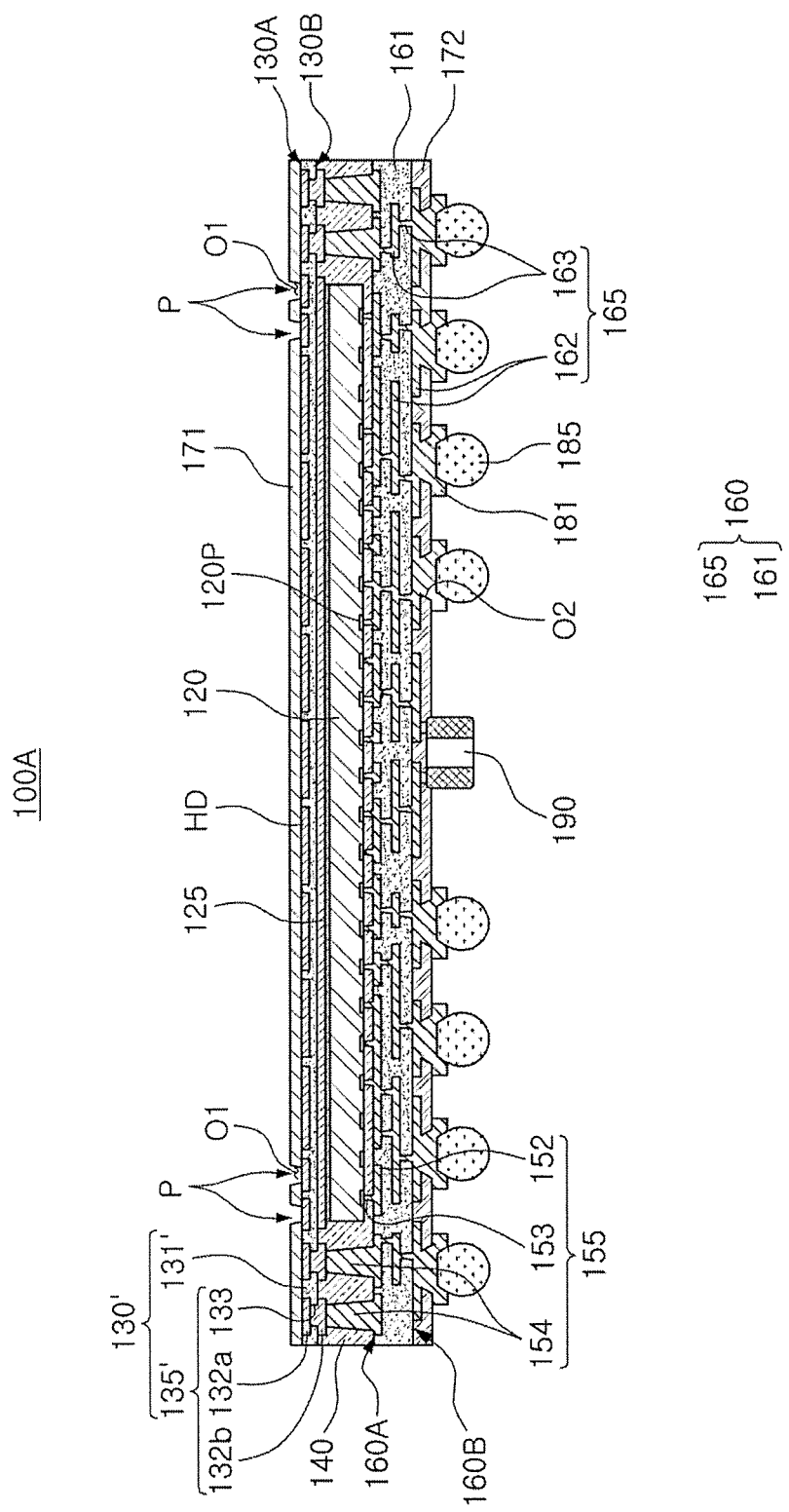
FIGS. 14 and 15 are side cross-sectional views illustrating semiconductor packages according to various exemplary embodiments in the present disclosure.
Figure 15:
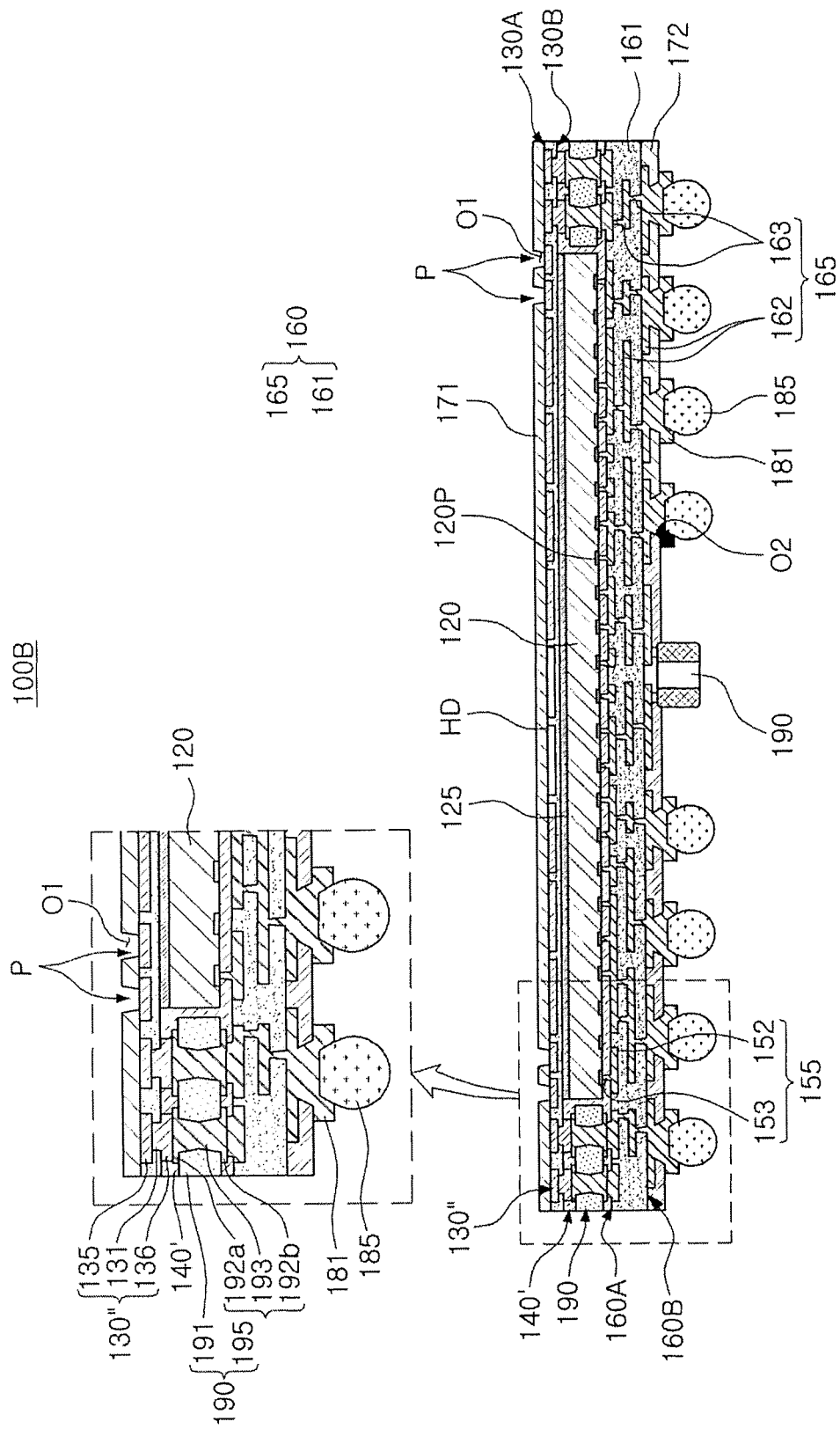

A case in which each of the insulating member 131 and the first redistribution layer 135 of the first connection member 130 used in the present exemplary embodiment includes a single layer is illustrated, but each of the insulating member 131 and the first redistribution layer 135 may include a plurality of layers (see FIGS. 14 and 15).

In the second connection member 160 used in the present exemplary embodiment, the third redistribution layer 165 may include a plurality of third wiring patterns 162 and a plurality of vias 163. In detail, the third redistribution layer 165 may include two third insulating layers 161, third wiring patterns 162 each disposed on the two third insulating layers 161, and vias 163 each connected to the third wiring patterns 162. The vias 163 of the third redistribution layer 165 may include vias connecting the second redistribution layer 155 and the third wiring patterns 162 to each other and vias connecting third wiring patterns 162 disposed on different levels to each other. A case in which the third redistribution layer 165 includes two-layer redistribution structures is illustrated. However, the third redistribution layer 165 is not limited thereto, but may have single-layer or three-layer or more redistribution structures.

The third insulating layer 161 of the third redistribution layer 165 may be formed of a photosensitive insulating material such as a photoimagable dielectric (PID). An area of a surface of the via 163 of the third redistribution layer 165 adjacent to the first surface 160A of the second connection member 160 may be smaller than that of a surface of the via 163 of the third redistribution layer 165 adjacent to the second surface 160B of the second connection member 160.

The respective components included in the semiconductor package 100 according to the present exemplary embodiment will hereinafter be described in more detail.

Figure 12:
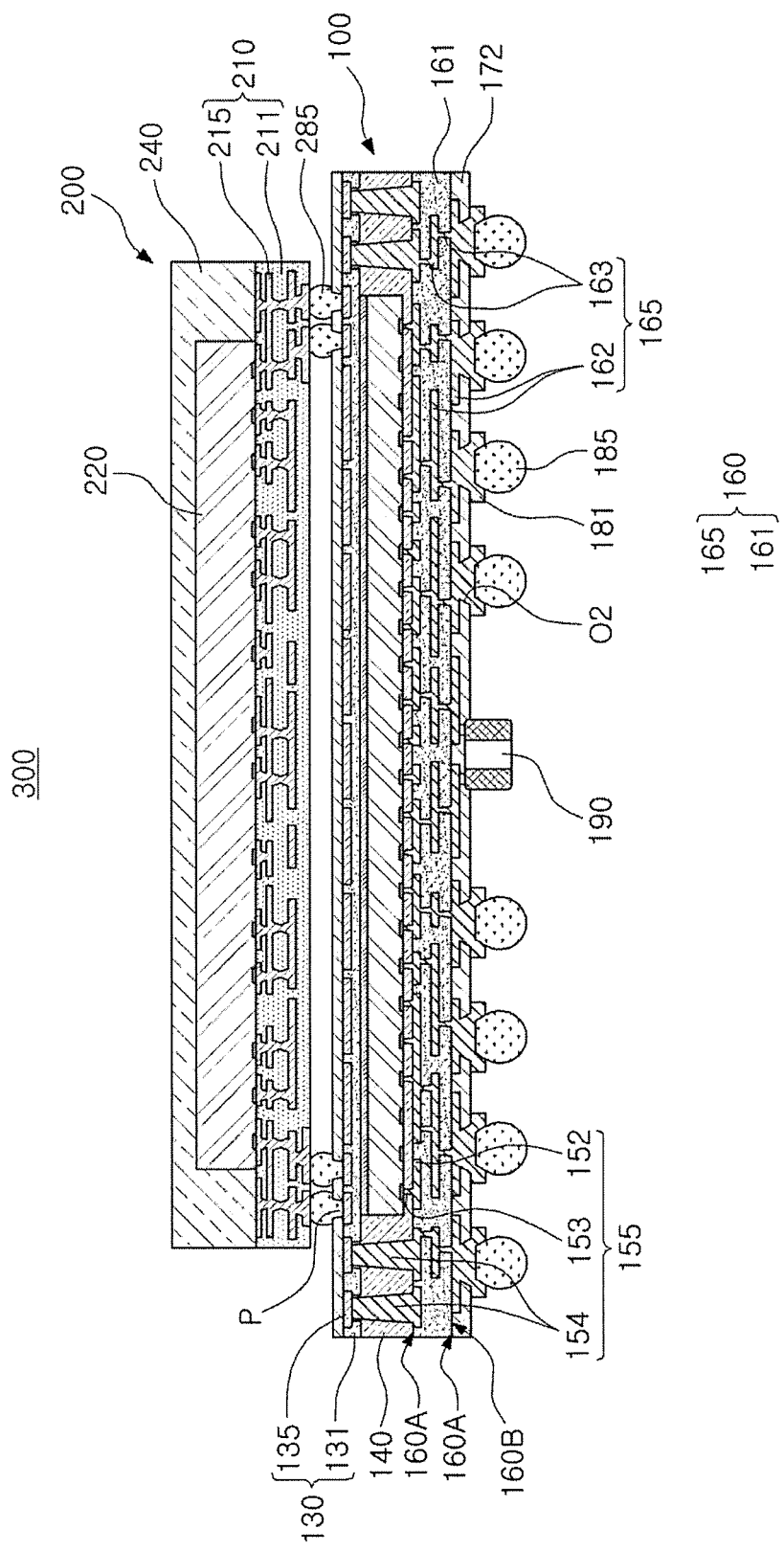
FIG. 12 is a side cross-sectional view illustrating a package-on-package (POP) structure including the semiconductor package illustrated in FIG. 9.

The first connection member 130 may be used as an interposer connecting upper and lower packages to each other (see FIG. 12). As described above, the first connection member 130 used in the present exemplary embodiment may be manufactured in advance before the semiconductor chip 120 is mounted. The insulating layer 131 of the first connection member 130 may be formed of a photosensitive insulating material such as a PID. The material of the insulating layer 131 is not limited thereto, but may be a thermosetting resin such as an epoxy resin, a thermoplastic resin such as a polyimide resin, or a resin in which a reinforcement material such as a glass fiber and/or an inorganic filler is impregnated, for example, prepreg, Ajinomoto Build up Film (ABF), FR-4, Bismaleimide Triazine (BT), or the like. The first redistribution layer 135 may include a conductive material such as copper (Cu), aluminum (Al), silver (Ag), tin (Sn), gold (Au), nickel (Ni), or alloys thereof, but is not limited thereto.

The semiconductor chip 120 may be bonded to the first connection member 130 through the bonding layer 125 such as an adhesive film, as described above, and be supported by the first connection member 130. The first connection member 130 may include a heat dissipation structure HD disposed on the inactive surface of the semiconductor chip 120. The heat dissipation structure HD may be provided by a metal pattern disposed on the same level as that of the wiring pattern of the first redistribution layer 135, but is not limited thereto. In another example, the heat dissipation structure HD may be formed in a stack structure including a metal layer and vias.

The second connection member 160 may be configured to redistribute the connection electrodes 120P of the semiconductor chip 120. In the present exemplary embodiment, the second connection member 160 may redistribute several tens to several hundreds of connection electrodes 120P of the semiconductor chip 120 having various functions together with the second redistribution layer 155 to physically and/or electrically connect the several tens to several hundreds of connection electrodes 120P to an external apparatus through the electrical connection structures 185. Particularly, in the connection electrodes 120P to which the second redistribution layer 155 is connected, other metal connectors such as conductive bumps are not introduced, and the second redistribution layer 155 may be directly connected to pad electrodes of a bare chip. The second connection member 160 may be connected to the connection electrodes 120P of the semiconductor chip 120, and may support the semiconductor chip 120 together with the first connection member 130.

The insulating layer 161 of the second connection member 160 may be formed of a photosensitive insulating material such as a PID resin. The third redistribution layer 165 may include a conductive material such as Cu, Al, Ag, Sn, Au, Ni, or alloys thereof.

As described above, the third redistribution layer 165 of the second connection member 160 may be electrically connected to the semiconductor chip 120 through the second wiring pattern 152 and the connection vias 153, and the first redistribution layer 135 of the first connection member 130 may be electrically connected to the semiconductor chip 120 in a bypass manner through the through-vias 154.

The encapsulant 140 may be configured to protect the semiconductor chip 120. In the present exemplary embodiment, the encapsulant 140 may cover the semiconductor chip 120, and may be formed in a region positioned in the vicinity of the semiconductor chip 120 between the first connection member 130 and the second connection member 160. The encapsulant 140 used in the present exemplary embodiment may be formed of a photosensitive insulating material. As described above, the vias for the second redistribution layer 155 are formed by a lithography process using a photoresist, and may thus be precisely implemented.

The semiconductor package 100 according to the present exemplary embodiment may further include the first and second passivation layers 171 and 172 disposed, respectively, on the first connection member 130 and the second connection member 160. The first and second passivation layers 171 and 172 may be configured to protect the first connection member 130 and the second connection member 160, respectively, from external physical or chemical damage, or the like. A material of each of the first and second passivation layers 171 and 172 is not particularly limited. For example, a solder resist may be used as the material of each of the first and second passivation layers 171 and 172.

The electrical connection structures 185 connected to the third redistribution layer 165 of the second connection member 160 may be configured to physically or electrically externally connect the semiconductor package 100. For example, the semiconductor package 100 may be mounted on the motherboard of the electronic device through the electrical connection structures 185, as described above.

For example, the electrical connection structures 185 may be formed of Cu, Al, Ag, Sn, Au, Ni, and one of combinations thereof or a low melting point alloy such as an Sn—Al—Cu alloy, but are not limited thereto, and the electrical connection structures 185 may have various structures such as lands, balls, pins, and the like.

At least one passive component 190 may be disposed on the second surface 160B of the second connection member 160, if necessary, and be connected to the third redistribution layer 165. In the present exemplary embodiment, the passive component 190 may be disposed between the electrical connection structures 185, but is not limited thereto.

As illustrated in FIG. 10B, some of the electrical connection structures 185 may be disposed in a fan-out region. A fan-out package may have excellent reliability as compared to a fan-in package, may implement a plurality of input/output (I/O) terminals, and may facilitate a 3D interconnection. An array (the number, an interval, or the like) of the electrical connection structures 185 is not particularly limited, but may be variously modified depending on a condition of an external apparatus on which the semiconductor package is to be mounted.

In the present exemplary embodiment, a case in which the electrical connection structures 185 are provided on only the second surface 160B of the second connection member 160 is illustrated, but connection terminals similar to the electrical connection structures 185 may also be provided on the first connection member 130, that is, the pads P, if necessary.

FIG. 12 is a side cross-sectional view illustrating a semiconductor device 300 of a package-on-package (POP) structure including the semiconductor package 100 illustrated in FIG. 9.

Referring to FIG. 12, the semiconductor device 300 according to the present exemplary embodiment may include the semiconductor package 100 provided as a lower package and an upper package 200 disposed on the first surface 130A of the first connection member 130.

The upper package 200 may include a connection member 210 provided as a support substrate and having insulating layers 211 and redistribution layers 215 formed on the insulating layers 211, a semiconductor chip 220 mounted on the connection member 210, and an encapsulant 240 formed on the connection member 210 and encapsulating the semiconductor chip 220.

The upper package 200 may be connected to the pads P of the lower package 100 using additional electrical connection structures 285 provided on the first surface 130A of the first connection member 130 of the lower package 100 to constitute one module.

A package-on-package (POP) may reduce a thickness of the device, and significantly reduce signal paths. For example, in a case of a graphic processor (GPU), it is required to significantly reduce signal paths between the GPU and a memory such as a high bandwidth memory (HBM). To this end, the upper package 200 and the lower package 100 may be used as a POP structure by stacking the upper package 200 including the semiconductor chip 220 such as the HBM on the lower package 100 in which the semiconductor chip 120 such as the GPU is mounted.

FIGS. 13A through 13G are cross-sectional views for describing main processes of a method of manufacturing the semiconductor package illustrated in FIG. 9.

Referring to FIG. 13A, the first connection member 130 including the first redistribution layer 135 may be formed on a carrier film 110.

The carrier film 110 may be used as a support for forming the first connection member 130 and supporting the first connection member 130 in some processes. The carrier film 110 used in the present exemplary embodiment may be a copper clad laminate such as a DCF including an insulating layer 101 and a metal layer 102. In another example, the carrier film 110 may be various types of known adhesive films. For example, the adhesive film may include a thermosetting adhesive tape of which adhesion is weakened by heat treatment, an ultraviolet-curable adhesive tape of which adhesion is weakened by ultraviolet ray irradiation, or the like.

The first connection member 130 may be obtained by forming the wiring pattern providing the first redistribution layer 135 on the carrier film 110 and forming the insulating member (131) (also referred to as the "insulating layer") on the first redistribution layer 135. In this case, the insulating layer 131 may be embedded in the first redistribution layer 135. In addition, a portion of the wiring pattern corresponding to the semiconductor chip 120 may be provided as a heat dissipation pattern HD. In the present exemplary embodiment, the first passivation layer 171 may be formed on the carrier film 110 in advance before the first redistribution layer 135 is formed, and the first connection member 130 may be formed on the first passivation layer 171.

The insulating layer 131 of the first connection member 130 may be formed of a photosensitive insulating material such as a PID. However, the insulating layer 131 is not limited thereto, but may include the other resins described above. A case in which first redistribution layer 135 of the first connection member 130 used in the present exemplary embodiment is formed in a single-layer wiring pattern structure is illustrated, but in another exemplary embodiment (see FIGS. 14 and 15), the first redistribution layer 135 may be implemented in a two-layer or more wiring structure including a plurality of wiring patterns and a plurality of vias connected to the plurality of wiring patterns.

Then, referring to FIG. 13B, the openings h may be formed in the insulating layer 131 so that portions of a region of the first redistribution layer 135 are exposed.

The openings h formed in the present process may expose portions of the region of the first redistribution layer 135 toward the second surface 130B of the first connection member 130. The regions of the first redistribution layer 135 exposed by the openings h may be provided as regions that are to be connected to through-vias 154 (see FIG. 13F). When the insulating layer 131 is formed of a photosensitive insulating resin, the present process may be performed by a photolithography process. In another exemplary embodiment, the present process of forming the openings h is not separately performed, and the insulating layer 131 may be opened in a process (see FIG. 13E) of forming the second holes H2 for the through-vias in the encapsulant 140.

Then, referring to FIG. 13C, the semiconductor chip 120 may be mounted on the second surface 130B of the first connection member 130.

The semiconductor chip 120 used in the present exemplary embodiment may have the active surface having a plurality of connection electrodes 120P disposed thereon and the inactive surface opposing the active surface. In the present process, the semiconductor chip 120 may be bonded to the first connection member 130 using the bonding layer 125 so that the inactive surface of the semiconductor chip 120 is in contact with the second surface 130B of the first connection member 130 manufactured in advance.

Since the first connection member 130 includes the heat dissipation pattern HD disposed in a region corresponding to the inactive surface of the semiconductor chip 120, heat generated from the semiconductor chip 120 may be easily dissipated outwardly through the heat dissipation pattern HD. Particularly, a portion of an underfill or the encapsulant 140 is not disposed between the first connection member 130 and the semiconductor chip 120, which may contribute to reducing an entire thickness of the semiconductor package, and a distance between the semiconductor chip 120 and the heat dissipation pattern HD may be reduced to ensure effective heat dissipation.

Then, referring to FIG. 13D, the encapsulant 140 may be formed on the second surface 130B of the first connection member 130 to encapsulate the semiconductor chip 120.

The encapsulant 140 may be formed of the photosensitive insulating material. In the present exemplary embodiment, the encapsulant 140 may cover the semiconductor chip 120, and may be formed in a region positioned in the vicinity of the semiconductor chip 120 on the first connection member 130. The encapsulant 140 may be divided into the first region 140A covering the semiconductor chip 120 and the second region 140B positioned in the vicinity of the semiconductor chip 120.

Figure 13E:
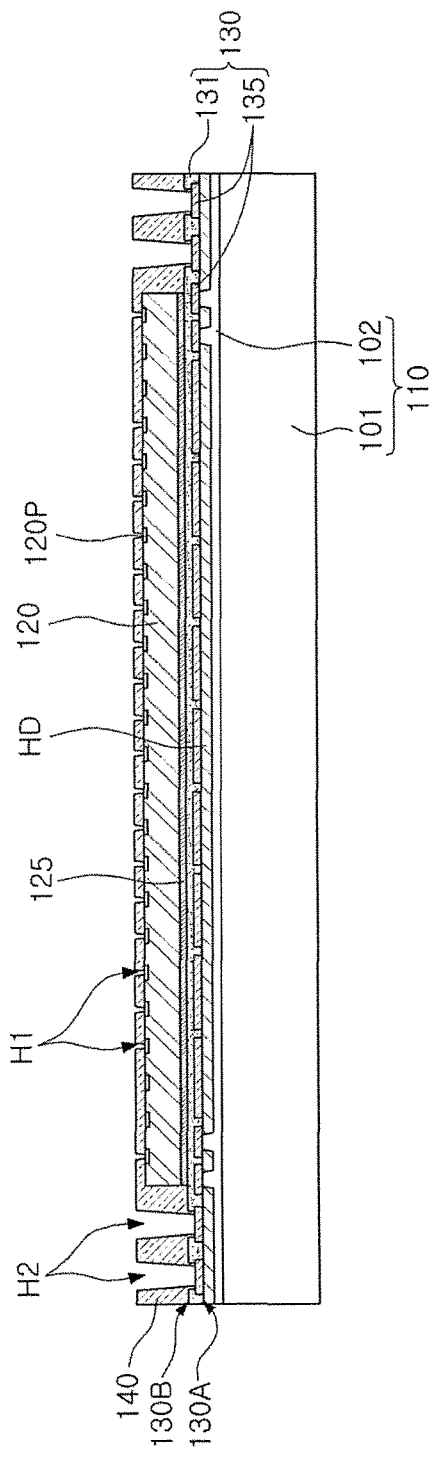

Then, referring to FIG. 13E, the first holes H1 exposing the connection electrodes 120P of the semiconductor chip 120 and the second holes H2 exposing portions of the region of the first redistribution layer 135 may be formed in the encapsulant 140.

In the present exemplary embodiment, the encapsulant 140 may be formed of the photosensitive insulating material, and a process of forming the holes may thus be precisely performed by a photolithography process. The first holes H1 for the connection vias 153 and the second holes H2 for the through-vias 154 may be simultaneously formed in the first region and the second region, respectively. The second holes H2 for the through-vias 154 may be connected to portions of the region of the first redistribution layer 135 of the first connection member 130 through the openings h prepared in advance in the insulating layer 131.

In the present process, the first holes H1 and the second holes H2 may be drilled from the upper surface of the encapsulant 140, and side cross sections of the first and second holes H1 and H2 may thus tend to become narrow toward a downward direction. In the present exemplary embodiment, in the connection electrodes 120P of the semiconductor chip 120, other metal connectors such as conductive bumps are not introduced, and a separate planarization process for exposing the conductive bumps, or the like, may not be required.

Figure 13F:
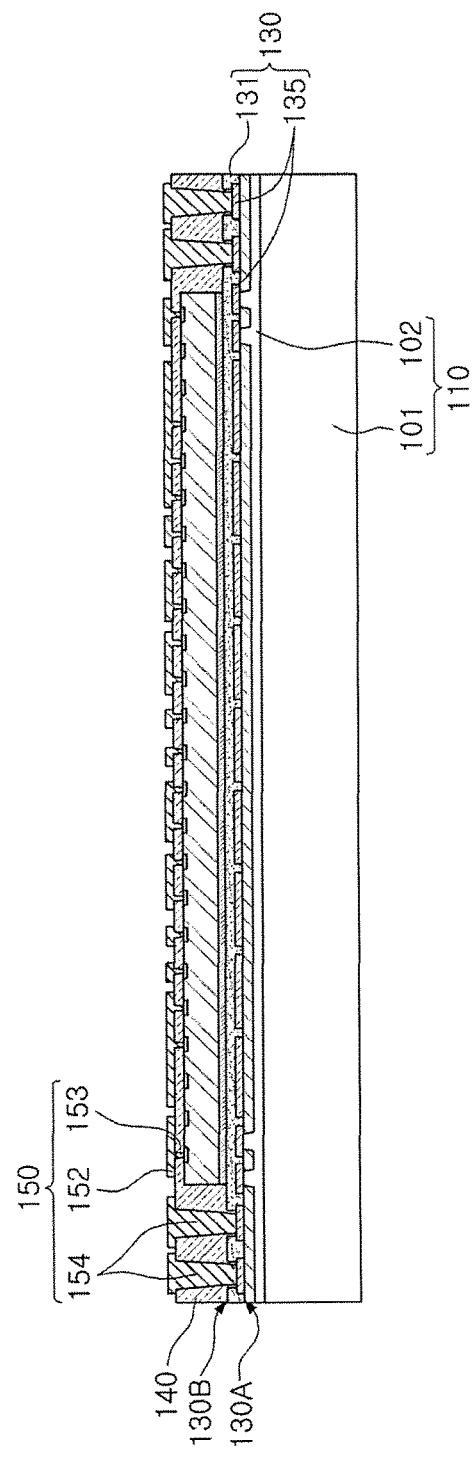

Then, referring to FIG. 13F, the second redistribution layer 155 may be formed on the encapsulant 140 so that the first holes H1 and the second holes H2 are filled.

The second redistribution layer 155 may be formed by forming a photoresist layer on the encapsulant 140, forming a photoresist pattern by a lithography process, performing a plating process, and then removing the photoresist pattern. The second redistribution layer 155 may include the connection vias 153 penetrating through the first region 140A of the encapsulant 140 and connected to the connection electrodes 120P and the through-vias 154 penetrating through the second region 140B of the encapsulant 140 and connected to the first redistribution layer 135.

In addition, the second redistribution layer 155 may include the second wiring pattern 152 disposed on the encapsulant 140 and connected to at least one of the connection vias (or the second vias) 153 and the through-vias 154. The second wiring pattern 152 may be formed together with the connection vias 153 and the through-vias 154. Resultantly, the second wiring pattern 152 may have the integrated structures with the connection vias 153 and the through-vias 154. As described above, the connection vias 153 and the through-vias 154 may be formed of the same metal as that of the second wiring pattern 152.

Figure 13G:
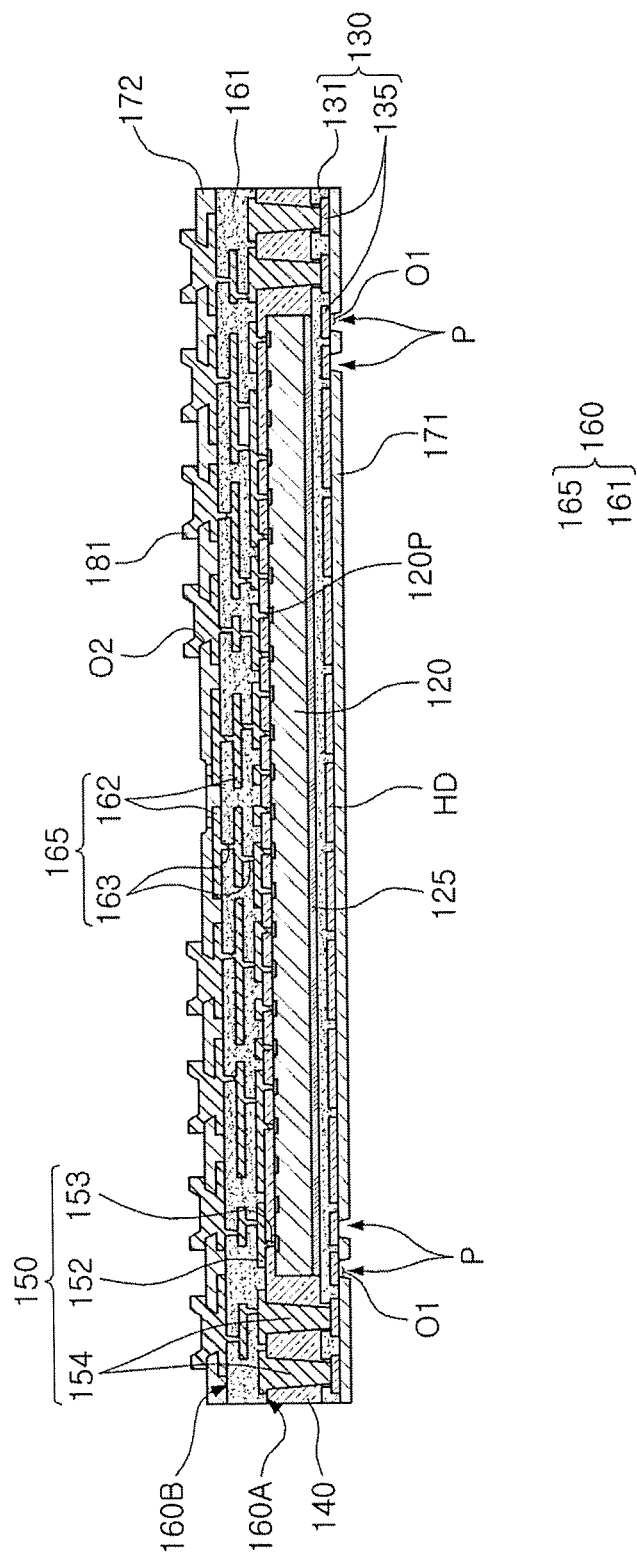

Then, referring to FIG. 13G, the second connection member 160 having the third redistribution layer 165 may be formed on the encapsulant 140.

The third redistribution layer 165 may be connected to the second redistribution layer 155. The third redistribution layer 165 may provide a backside redistribution structure together with the second redistribution layer 155. Each of the insulating layers 161 may be formed of the photosensitive insulating material such as the PID, and the third redistribution layer 165 may be formed by the lithography process using the photoresist.

In detail, the third redistribution layer 165 may include the third wiring pattern 162 and the vias 163 formed using the two insulating layers 161. Since the third wiring pattern 162 and the vias 163 related to the respective insulating layers 161 are formed by the same plating process, they may have an integrated structure. The third redistribution layer 165 may include a conductive material such as copper (Cu), aluminum (Al), silver (Ag), tin (Sn), gold (Au), nickel (Ni), or alloys thereof.

The second passivation layer 172 may be formed on the second surface 160B of the second connection member 160 using a material similar to that of the first passivation layer 171, the second openings O2 may be formed so that the third redistribution layer 165 is exposed, and the UBM layer 181 may then be formed. The carrier film may be removed, and the first openings O1 may be formed in the first passivation layer 171.

If necessary, the electrical connection structures 185 may be formed on the UMB layer 181, and a required passive component 190 may be mounted to manufacture the semiconductor package 100 illustrated in FIG. 9.

The semiconductor package according to the present exemplary embodiment may be modified into various structures.

In the semiconductor package 100 according to an exemplary embodiment, a case in which the redistribution layer of the first connection member is formed of single wiring pattern is illustrated, but the redistribution layer of the first connection member may also be implemented by two more wiring patterns and vias (see FIG. 14).

In addition, in the semiconductor package 100 according to an exemplary embodiment, the through-vias 154 disposed in the second region 140B of the encapsulant 140 may be provided as vertical connection structures connecting the first and third redistribution layers 135 and 165 to each other. Alternatively, the vertical connection structures may be formed by introducing other structures such as a support member having a through-wiring structure (see FIG. 15).

FIGS. 14 and 15 are side cross-sectional views illustrating semiconductor packages according to various exemplary embodiments in the present disclosure.

Referring to FIG. 14, it may be understood that a semiconductor package 100A according to an exemplary embodiment is similar to the semiconductor package 100 illustrated in FIGS. 9 through 11 except that a first redistribution layer 135' of a first connection member 130' is formed in a multilayer structure. Components according to the present exemplary embodiments may be understood with reference to the description for the same or similar components of the semiconductor package 100 illustrated in FIGS. 9 through 11 unless explicitly described to the contrary.

The first redistribution layer 135' of the first connection member 130' used in the present exemplary embodiment may include a plurality of wiring patterns 132a and 132b and a plurality of vias 133 connected to the plurality of wiring patterns 132a and 132b. The first redistribution layer 135' having such a multilayer structure may be implemented by a process similar to the process illustrated in FIG. 13A. That is, the first redistribution layer 135' may be manufactured by forming an additional wiring pattern on the insulating layer in the structure illustrated in FIG. 13A and then forming an additional insulating layer on the wiring pattern. As described above, an insulating member of the first connection member may include two insulating layers. Since the first redistribution layer 135' is formed by such a process, a via 133 of the first redistribution layer 135' may have a specific shape depending on a direction thereof. That is, an area of a surface of the via 133 adjacent to a first surface 130A of the first connection member 130' may be smaller than that of a surface of the via 133 adjacent to a second surface 130B of the first connection member 130'. In the present exemplary embodiment, the first connection member 130' is manufactured in advance before a semiconductor chip 120 is mounted, and a shape of the via may thus be reversed, if necessary.

The wiring pattern 132a adjacent to the first surface 130A of the first connection member may be embedded in an insulating layer 131, portions of regions of the wiring pattern 132a may be exposed by first openings O1 of a first passivation layer 171, and the exposed regions may provide regions for a plurality of pads P. The wiring pattern 132b adjacent to the second surface 130B of the first connection member may also be embedded in the insulating layer 131, but may be exposed toward the second surface 130B of the first connection member, and exposed regions may be connected to through-vias 154. A heat dissipation structure HD provided in the first connection member 130 may include two metal patterns provided on the same levels as those of two wiring patterns, and may include a plurality of vias connecting the two metal patterns to each other, if necessary.

Referring to FIG. 15, it may be understood that a semiconductor package 100B according to an exemplary embodiment is similar to the semiconductor package 100 illustrated in FIGS. 9 through 11 except that a vertical connection structure is implemented by a support member 190 having a through-wiring structure 195. Components according to the present exemplary embodiments may be understood with reference to the description for the same or similar components of the semiconductor package 100 illustrated in FIGS. 9 through 11 unless explicitly described to the contrary.

A first connection member 130" used in the present exemplary embodiment may further include a connection pattern 136 disposed in a region of an encapsulant 140' positioned in the vicinity of a semiconductor chip 120, connected to a first redistribution layer 135, and protruding from a second surface of the first connection member 130". The connection pattern 136 may be formed in the process of manufacturing the first connection member illustrated in FIG. 13A.

In the present exemplary embodiment, the vertical connection structure may be provided by a support member 190 having a through-wiring structure 195 instead of being formed in a second region of the encapsulant 140. The support member 190 may include an insulating support 191, wiring patterns 192a and 192b disposed on upper and lower surfaces of the insulating support 191, respectively, and a via 193 connecting the wiring patterns 192a and 192b to each other. The insulating support 190 may be formed of the insulating material described above, and may be provided as a plurality of unit blocks or be a rectangular structure having a cavity formed in a mounting region of the semiconductor chip.

The support member 190 may be coupled to the semiconductor package 100B in various manners. For example, in a process (see FIG. 13O) of attaching the semiconductor chip 120 to the first connection member 130", the support member 190 having the through-wiring structure may be disposed on the first connection member 130" in the vicinity of the semiconductor chip 120, and the connection pattern 136 connected to the first redistribution layer 135 and the through-wiring structure 195 may be connected to each other. Then, the encapsulant 140' is formed, such that the support member 190 as well as the semiconductor chip 120 may be coupled to the first connection member 130". Particularly, the encapsulant 140' may be formed to cover the wiring pattern 192b of the support member 190, and holes exposing the wiring pattern 192b of the support member 190 may be formed at the time of forming first holes H1 opening the connection electrodes 120P, as in FIG. 13E, and a third redistribution layer connected to the wiring pattern 192b of the support member 190 may be formed in a subsequent process.

As set forth above, according to the exemplary embodiments in the present disclosure, a connection structure and a process may be simplified and a heat dissipation path for the semiconductor chip may be effectively improved, by utilizing the connection member manufactured in advance. In addition, the vertical connection structures of the redistribution layers may be manufactured together with a redistribution structure for the semiconductor chip by introducing the photosensitive material as a material of the encapsulant.

While exemplary embodiments have been shown and described above, it will be apparent to those skilled in the art that modifications and variations could be made without departing from the scope of the present invention as defined by the appended claims.

What is claimed is:
1. A semiconductor package comprising:
a first connection member having a first surface and a second surface opposing each other in a stacking direction of the semiconductor package, the first connection member including an insulating member and a first redistribution layer embedded in the insulating member and having exposed regions in the second surface;
a semiconductor chip having an active surface having connection electrodes disposed thereon, and an inactive surface opposing the active surface in the stacking direction and disposed on the first connection member, the inactive surface facing the second surface of the first connection member;
an encapsulant disposed on the second surface of the first connection member, including a photosensitive insulating material, and having a first region covering the active surface of the semiconductor chip and a second region positioned in the vicinity of the semiconductor chip;
a second redistribution layer including connection vias penetrating through the first region of the encapsulant and connected to the connection electrodes, through-vias penetrating through the second region of the encapsulant and connected to the exposed regions of the first redistribution layer, and a wiring pattern disposed on the encapsulant and having an integrated structure with the connection vias and the through-vias; and
a second connection member having a third surface disposed on the encapsulant and a fourth surface opposing the third surface in the stacking direction, the second connection member including a third redistribution layer connected to the second redistribution layer,
wherein an area of a surface of at least one of the through-vias adjacent to the first connection member is smaller than an area of a surface of the at least one of the through-vias adjacent to the second connection member.

2. The semiconductor package of claim 1, wherein each of the through-vias passes through the insulating member and is connected to the first redistribution layer.

3. The semiconductor package of claim 1, wherein the first redistribution layer includes a first wiring pattern embedded in the insulating member and exposed to the first surface of the first connection member, a second wiring pattern protruding from the second surface of the first connection member, and vias connecting the first and second wiring patterns to each other.

4. The semiconductor package of claim 3, wherein the vias of the first redistribution layer each have a width that decreases toward the first surface of the first connection member.

5. The semiconductor package of claim 1, wherein the connection vias and the through-vias are formed of substantially the same metal.

6. The semiconductor package of claim 1, further comprising a bonding layer disposed between the inactive surface of the semiconductor chip and the second surface of the first connection member.

7. The semiconductor package of claim 1, wherein the first connection member further includes a heat dissipation pattern disposed in a region corresponding to the semiconductor chip.

8. The semiconductor package of claim 7, wherein the first redistribution layer includes one or more wiring patterns, and
the heat dissipation pattern is disposed on the same level as that of one of the one or more wiring patterns.

9. The semiconductor package of claim 1, further comprising a first passivation layer disposed on the first surface of the first connection member,
wherein the first passivation layer has openings exposing portions of a region of the first redistribution layer.

10. The semiconductor package of claim 1, further comprising an electrical connection structure disposed on the fourth surface of the second connection member and connected to the second redistribution layer.

11. The semiconductor package of claim 10, further comprising a second passivation layer disposed on the fourth surface of the second connection member.

12. The semiconductor package of claim 10, further comprising an underbump metallurgy (UMB) layer disposed on the second surface of the second connection member and connecting the third redistribution layer and the electrical connection structure to each other.

13. The semiconductor package of claim 1, wherein the insulating member of the first connection member includes a photosensitive insulating material.

14. The semiconductor package of claim 1, wherein an area of a surface of the connection vias adjacent to the semiconductor chip is smaller than that of a surface of the connection vias adjacent to the second connection member.

15. The semiconductor package of claim 1, wherein the third redistribution layer includes one or more wiring patterns and a plurality of vias connecting the one or more wiring patterns of the third redistribution layer.

16. The semiconductor package of claim 15, wherein the plurality of vias of the third redistribution layer have widths that decrease toward the third surface of the second connection member.

17. A semiconductor package comprising:
a first connection member having a first surface and a second surface opposing each other in a stacking direction of the semiconductor package, including an insulating member and a first redistribution layer embedded in the insulating member, and having holes formed in the second surface to be connected to portions of the first redistribution layer;
a semiconductor chip having an active surface having connection electrodes disposed thereon, and an inactive surface opposing the active surface in the stacking direction and disposed on the first connection member, the inactive surface facing the second surface of the first connection member;
an encapsulant disposed on the second surface of the first connection member, including a photosensitive insulating material, and having a first region covering the active surface of the semiconductor chip and a second region positioned in the vicinity of the semiconductor chip; and
a second redistribution layer including connection vias penetrating through the first region of the encapsulant and connected to the connection electrodes, through-vias penetrating through the second region of the encapsulant and connected to the first redistribution layer through the holes of the first connection member, and a wiring pattern disposed on the encapsulant and having an integrated structure with the connection vias and the through-vias,
wherein an area of a surface of at least one of the through-vias adjacent to the first redistribution layer is smaller than an area of a surface of the at least one of the through-vias adjacent to the wiring pattern.

* * * * *